United States Patent [19]

Hayakawa et al.

[11] Patent Number: 5,624,782
[45] Date of Patent: Apr. 29, 1997

[54] METHOD OF MANUFACTURING THICK-FILM RESISTOR ELEMENTS

[75] Inventors: Keiichiro Hayakawa, Yokohama, Japan; Jerome D. Smith, Cary, N.C.; Hidehiro Yamada, Kanagawa, Japan

[73] Assignee: E. I. Du Pont de Nemours and Company, Wilmington, Del.

[21] Appl. No.: 439,323

[22] Filed: May 11, 1995

[30] Foreign Application Priority Data

Apr. 14, 1994 [JP] Japan .................................. 6-99190

[51] Int. Cl.$^6$ ........................................... G03F 7/00
[52] U.S. Cl. .................... 430/198; 430/315; 430/330; 427/58; 427/102; 427/126.1; 432/13
[58] Field of Search .................................. 430/311, 315, 430/319, 324, 330, 198; 427/58, 101, 102, 126.1; 432/13

[56] References Cited

U.S. PATENT DOCUMENTS

| | | | |
|---|---|---|---|
| 3,583,931 | 6/1971 | Bouchard | 252/320 |
| 4,054,483 | 10/1977 | Peiffer | 156/632 |
| 5,124,234 | 6/1992 | Wakata et al. | 430/280 |
| 5,169,493 | 12/1992 | Nii | 156/659.11 |

FOREIGN PATENT DOCUMENTS

| | | |
|---|---|---|
| 0186163 | 7/1986 | European Pat. Off. . |
| 0568853 | 11/1993 | European Pat. Off. . |
| 2666682 | 3/1992 | France . |
| 2681958 | 4/1993 | France . |
| 1241121 | 7/1971 | United Kingdom . |

*Primary Examiner*—Kathleen Duda

[57] ABSTRACT

To provide a method of manufacturing thick-film resistor elements that forms thick-film resistors having a uniform thickness on a substrate surface with high precision.

A method of manufacturing thick-film resistor elements by applying a thick-film resistor composition, obtained by dispersing a conductive component and an inorganic binder in an organic medium and which has a specified rheology, through a clear relief image obtained by exposing, curing, and developing a resist layer of a photopolymerizable mixture formed on an insulating substrate according to the resist pattern, and the thick-film paste obtained at this time has almost the same thickness as the photopolymerizable layer on the surface of the insulating substrate and is patterned according to the high-precision pattern defined by the sharp, linear, lateral edge enclosed by the resist image removed by development.

6 Claims, 3 Drawing Sheets

METHOD OF MANUFACTURING THICK-FILM RESISTOR ELEMENTS

FIELD OF THE INVENTION

The present invention relates to a method of forming thick-film resistors, and in particular a method of manufacturing thick-film resistor elements that improves the pattern precision of the resistors and thereby can reduce the variation in film thickness of the resistors.

BACKGROUND OF THE INVENTION

A resistor film is formed on an insulating substrate by applying a paste, obtained by kneading conductive microparticles, the conductive component which contains an oxide of ruthenium or ruthenium pyrochlore oxide, and glass powder together with an organic vehicle, on the insulating substrate by screen printing to a wet thickness of about 30–80 μm and calcining at the required temperature, and thick-film resistor electronic parts and thick film hybrid circuits, etc., are formed.

When a thick-film resistor composition is used for hybrid microelectronic circuits or chip resistors, etc., it is important that it be electrically stable and in particular that there is little variation in the temperature coefficient of resistance (TCR) for changes in pad length (width) of diverse resistors. The size of resistors in recent years has varied from extremely small (e.g., 0.3×0.3 mm) to a size of several square millimeters, depending on the design of that device. However, when combining with Pd/Ag electrodes or Ag electrodes, etc., if the resistor shape becomes smaller, resistance values and TCR of the resistor thick film will vary due to change in the printing shape or film thickness or to diffusion of Ag, etc., from the electrodes. Consequently, when forming multiple resistors at the same time, as in manufacturing chip resistors, for example, the resistance values of the individual resistors will differ, and it is extremely difficult to lessen the variation in resistance values.

To further reduce that variation in resistance values, controlling the film thickness of the paste printed can be considered. Here, "screen printing" consists of placing a screen with stainless-steel mesh at a regular gap from the substrate to be printed, moving a squeegee made from hard rubber or fluoroelastomer parallel to the frame of the screen, and printing the paste on the substrate surface through a stencil. However, if the squeegee blade slants with respect to the printing screen or if the squeegee does not move parallel to the screen, or if the flatness of the substrate surface cannot be ensured, it is extremely difficult to print and form a paste film for forming patterned resistors of uniform thickness on the substrate. If the printing pressure is high, the pattern precision also degrades due to spreading of the printed shape. If the theology of the paste changes, the printed film thickness will change according to the kind and lot of the paste and with the passage of time during printing. Consequently, there are limits to improving the variation in film thickness and pattern precision of the resistors formed by screen printing.

Consequently, the objective of this invention is to provide a method of preparing thick-film resistor elements, which is a new and improved method of forming thick-film resistors and which can form thick-film resistors of uniform thickness on the substrate surface with high pattern precision and can markedly inhibit this variation in resistance values.

This invention provides a method of manufacturing thick-film resistor elements by applying a thick-film resistor composition, obtained by dispersing a conductive component and an inorganic binder in an organic solvent and which has a specified rheology, through a clear resist image obtained by exposing, curing, and developing a resist layer of photopolymerizable mixture formed on an insulating substrate according to a resist pattern, where the thick film paste obtained at that time is about the same thickness as the photopolymerizable layer and is patterned according to a high-precision pattern defined by the sharp, linear lateral edge enclosed by the resist image removed by development.

SUMMARY OF INVENTION

The invention is directed to a method of manufacturing thick-film resistor elements comprising the sequential steps:

printing and calcining a conductive material for forming electrodes that connect resistors on the surface of a heat-resistant insulating substrate, forming a layer consisting of a photopolymerizable mixture so that it covers the electrodes and substrate surface, curing the said photopolymerizable layer at the places where the resistor material, obtained by dispersing a composition that consists of a conductive component and an inorganic binder in an organic medium, is to be printed in order to form resistors so that part overlaps the electrodes by exposure corresponding to a prescribed pattern and forming a printing pattern for printing the said resistor material by developing with a developer, applying the said resistor material on the surface of the substrate through the said printing pattern so that part overlaps the electrodes and forming a patterned thick film, drying the thick film consisting of the said resistor material applied to the board by the aforementioned process, and calcining the thick film dried by the aforementioned process, volatilizing the organic medium in the resistor material, and sintering.

DETAILED DESCRIPTION OF THE INVENTION

Figure 1:
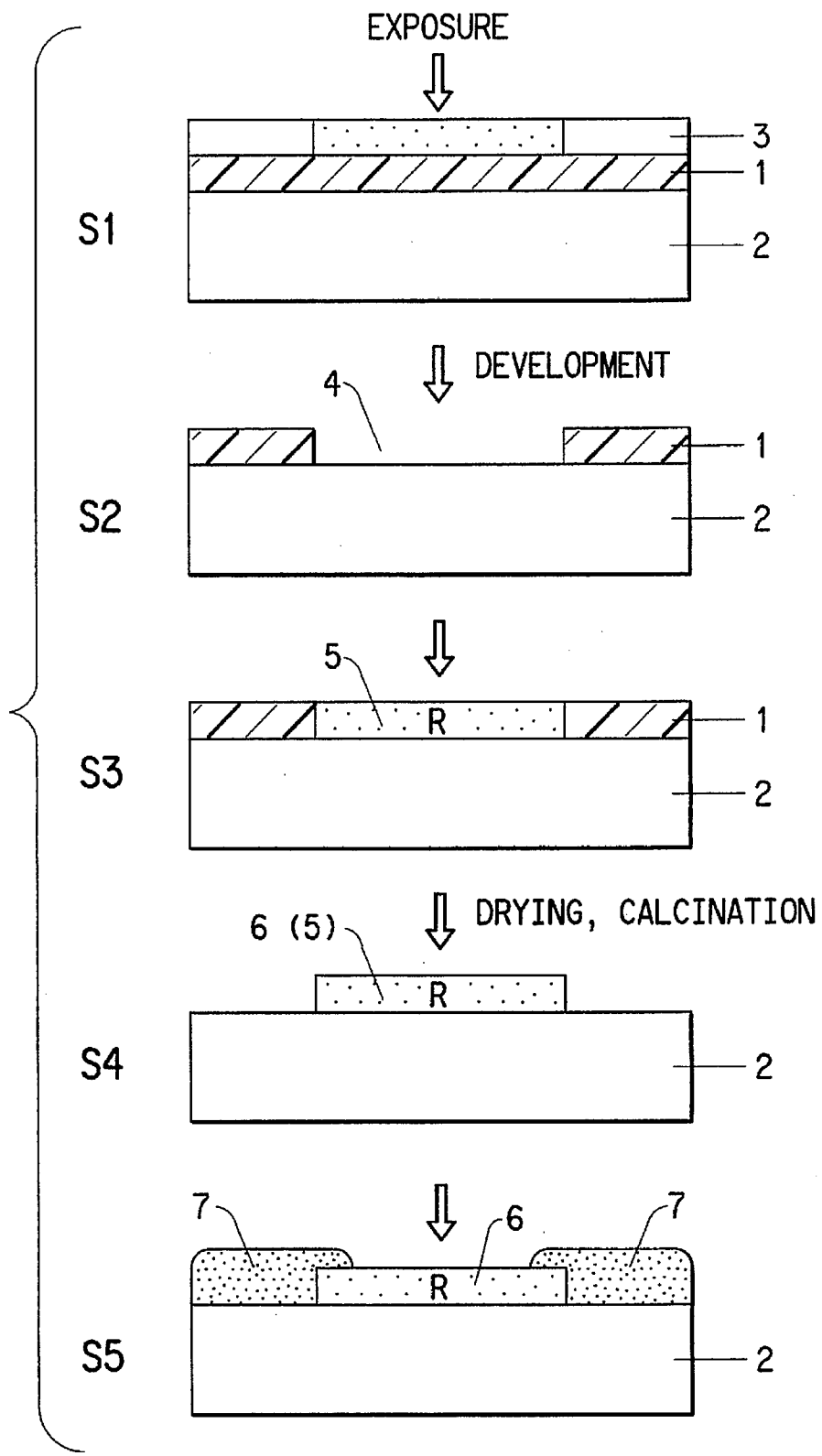
FIG. 1 is a cross section of the thick-film electronic circuit to explain the process of manufacturing the thick-film resistor elements of this invention.

For the photopolymerizable layer used in this invention, a dry film-type photoresist or a liquid developable resist ink can be used. The dry film-type photoresist contains an ethylenically unsaturated monomer, thermoplastic polymer-like binder, and an addition polymerization initiator that is activated by actinic light. It is dry to the touch. Typically, these components constitute 10–40%, 40–90%, and 1–10%, respectively, of the total weight of all three components.

Each of these components can be a simple component or can be several components that perform the intended function in the composition.

The monomer and photoinitiator employed are the usual components. Examples of the monomer are trimethylolpropane triacrylate, ethylene glycol diacrylate, diethylene glycol diacrylate, pentaerythritol triacrylate, and tetraethylene glycol diacrylate. Examples of the photoinitiator are benzophenone, Michler's ketone, and mixtures of those, hexaarylbiimidazole and leuko dyes.

Other binders, monomers, and photoinitiators that can be used in this invention have been disclosed in U.S. Pat. No. 4,054,483. Other additives such as plasticizers, inhibitors, and colorants can also be included in the photopolymerizable (photosensitive) layer.

As for the binder, at least 40% of the weight of the binder is one or more acrylic units, that is, an acrylic polymer derived from acrylic acid, methacrylic acid, or esters or nitriles of those. Examples of such polymers are poly (methyl methacrylate) and acrylic acid, methacrylic acid, $C_2$–$C_5$ alkyl (meth) acrylates, and copolymers and terpolymers with styrene and acrylonitrile. Styrene/maleic anhydride and ethylene/butadiene and poly(vinyl acetate) copolymer can also be used.

However, as liquid developable resist inks, there are photopolymerizable coating compositions that contain the solid or semisolid reaction products of polyepoxides and ethylenically unsaturated carboxylic acids, inert inorganic fillers, photopolymerization initiators, and volatile organic solvents and liquid resist ink compositions that contain particular actinic-energy-curable resins with a novolak resin as the backbone, polymerization initiator, diluent, and a thermosetting component that can be developed with an aqueous alkali solution without using an organic solvent as developer. In the case of a dry film, the photopolymerizable layer is placed between the support film and cover film in sandwich form. The cover film is removed, the photopolymerizable layer is laminated on the surface of the substrate, for example, a dielectric substrate, with heat and pressure, that layer is image-wise exposed by illumination with actinic rays, the support film is removed, and the exposed resist is developed by removing the unexposed part with a solvent. As a result, a relief resist image is formed on that surface.

A liquid resist ink composition is coated on the entire surface of the substrate by screen printing, roll coating, or curtain coating, etc., the required part is cured by illumination with actinic energy, the unexposed part is dissolved with dilute aqueous alkali solution and post-cured with further heating to form the resist film that is the objective.

The thick-film resistor composition used in this invention contains a conductive component, an inorganic binder, and an organic medium (vehicle) as its principal components.

Conducyive Component

The thick-film resistor composition used in this invention contains an oxide of ruthenium or ruthenium pyrochlore oxide as the conductive component. Ruthenium pyrochlore oxide is a kind of pyrochlore oxide, a multicomponent compound of $Ru^{+4}$, $Ir^{+4}$, or mixture (M") of those, represented by the following general formula

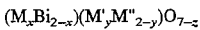

$(M_xBi_{2-x})(M'_yM''_{2-y})O_{7-z}$ wherein M is selected from the group consisting of yttrium, thallium, indium, cadmium, lead, copper, and rare earth metals, M' is selected from the group consisting of platinum, titanium, chromium, rhodium, and antimony, M" is ruthenium, iridium, or a mixture of those, x is 0–2, but for monovalent copper, $x \leq 1$, y is 0–0.5, but when M' is rhodium or more than one of platinum, titanium, chromium, rhodium, and antimony, y is 0–1, and z is 0–1, but when M is divalent lead or cadmium, z is equal to at least about x/2.

These ruthenium pyrochlore oxides have been described in detail in U.S. Pat. No. 3,583,931.

The preferred ruthenium pyrochlore oxides are bismuth ruthenate, $Bi_2Ru_2O_7$, and lead ruthenate, $Pb_2Ru_2O_6$. The reasons are that they are easily obtained in pure form, are not adversely effected by glass binders, have relatively small TCR, and are stable even when heated to about 1000° C. in air, and are relatively stable in a reducing atmosphere. Of the two, lead ruthenate, $Pb_2Ru_2O_6$, is preferred. Besides these, pyrochlores of $Pb_{1.5}Bi_{0.5}Ru_2O_{6.20}$ can also be used. For all of these, y=0.

The oxide of ruthenium or ruthenium pyrochlore oxide is used in a ratio of 10–50 wt %, preferably 12–40 wt %, based on the total weight of the composition containing the organic medium. If based on the total inorganic solids, the amount used is 14–75 wt %, preferably 17–57 wt %. "Total inorganic solids" means the total of conductive component and inorganic binder. When the composition of this invention contains inorganic additives besides the conductive component and inorganic binder, the "total inorganic solids" includes these inorganic additives.

Inorganic Binder

As the inorganic binder in the thick-film resistor composition used in this invention, various glasses that have generally been used for thick-film resistor compositions can be employed. That is, glass that contains about 40–80 wt % of PbO and 10–50 wt % of $SiO_2$, the total of PbO and $SiO_2$ being at least 60%, can be used. For example, lead silicate glass that contains 23–34 wt % $SiO_2$ and lead borosilicate glass that contains about 52–73 wt % PbO and about 4–14 wt % $B_2O_3$ can be used. Examples of the composition of glasses that can be used as the inorganic binder in this invention are shown in Table 1 and Table 2. The glasses shown in Tables 1 and 2 can be produced by the usual methods.

TABLE 1

| | Glass binder (wt %) | | | | | | | | | |
|---|---|---|---|---|---|---|---|---|---|---|
| | No. 1 | No. 2 | No. 3 | No. 4 | No. 5 | No. 6 | No. 7 | No. 8 | No. 9 | No. 10 |
| $SiO_2$ | 28.8 | 29.0 | 23.5 | 25.9 | 34.0 | 26.0 | 25.0 | 24.0 | 24.0 | 35.5 |
| $ZrO_2$ | | | 4.0 | | | | 4.0 | 4.0 | 2.0 | |

TABLE 1-continued

| | \multicolumn{10}{c}{Glass binder (wt %)} | | | | | | | | | |
| | No. 1 | No. 2 | No. 3 | No. 4 | No. 5 | No. 6 | No. 7 | No. 8 | No. 9 | No. 10 |
|---|---|---|---|---|---|---|---|---|---|---|
| $TiO_2$ | | | | | | | | 4.0 | | |
| $B_2O_3$ | | | 25.4 | 10.0 | | 10.0 | 10.0 | 10.0 | 10.0 | 3.1 |
| $Al_2O_3$ | | | 6.4 | 2.5 | 1.0 | 2.5 | 1.0 | 2.5 | 2.5 | 1.2 |
| PbO | 71.2 | 69.0 | | 61.6 | 65.0 | 59.0 | 57.5 | 53.5 | 58.5 | 62.2 |
| BaO | | | 1.0 | | | | | | | |
| CaO | | | 4.0 | | | | | | | |
| ZnO | | | 27.2 | | | | | | | |
| $Li_2O$ | | 2.0 | | | | 2.0 | 2.0 | 2.0 | 3.0 | |
| $Na_2O$ | | | 8.5 | | | | | | | |

TABLE 2

| | \multicolumn{10}{c}{Glass binder (mol %)} | | | | | | | | | |
| | No. 1 | No. 2 | No. 3 | No. 4 | No. 5 | No. 6 | No. 7 | No. 8 | No. 9 | No. 10 |
|---|---|---|---|---|---|---|---|---|---|---|
| $SiO_2$ | 60.0 | 56.2 | 28.0 | 49.3 | 65.4 | 46.4 | 45.0 | 41.8 | 42.3 | 62.5 |
| $ZrO_2$ | | | 2.4 | | | | 3.6 | 3.5 | 1.7 | |
| $TiO_2$ | | | | | | | | | 5.2 | |
| $B_2O_3$ | | | 25.9 | 16.3 | | 15.3 | 15.4 | 14.9 | 15.1 | 4.9 |
| $Al_2O_3$ | | | 4.4 | 2.9 | 1.0 | 2.7 | 1.0 | 2.6 | 2.6 | 1.3 |
| PbO | 40.0 | 36.0 | | 31.5 | 33.6 | 28.4 | 27.8 | 25.0 | 27.7 | 31.3 |
| BaO | | | 0.5 | | | | | | | |
| CaO | | | 5.1 | | | | | | | |
| ZnO | | | 24.0 | | | | | | | |
| $Li_2O$ | | 7.8 | | | | 7.2 | 7.2 | 7.0 | 10.8 | |
| $Na_2O$ | | | 9.7 | | | | | | | |

The above-indicated glasses can be employed as the inorganic binder in the thick-film resistor compositions used in this invention. However, a more desirable effect can be obtained by using a mixture of a first glass containing 30–60 wt % $SiO_2$, 5–30 wt % CaO, 1–40 wt % $B_2O_3$, 0–50 wt % PbO, and 0–20 wt % $Al_2O_3$, the total $SiO_2$, CaO, $B_2O_3$, PbO, and $Al_2O_3$ comprising at least 95 wt % thereof, and a second glass composed of a PbO-$SiO_2$ system glass in which PbO accounts for at least 50 wt %.

The first glass contains only 50 wt % of lead oxide at most, so it is generally a high-softening glass. The second glass contains at least 50 wt % of lead oxide, so generally it is a low-softening glass.

Neither the first nor the second glass can be used alone as the glass binder of the thick-film resistor compositions. The reasons are that the former glass does not sinter, and the latter glass is too soft and the resistor shape collapses. By using a mixture of such glasses that could not be used alone, thick-film resistors that exhibit little shape effect of TCR and also little variation in resistance values and TCR on calcining the overcoat glass are obtained.

The first glass is a glass in which the total $SiO_2$, CaO, $B_2O_3$, PbO, and $Al_2O_3$ constitutes 95 wt % thereof. The amount of $SiO_2$ must be at least 30 wt %. If less than that, a sufficiently high softening point is difficult to obtain. But it is no higher than 60 wt %, because if greater than that, there is a risk that Si will crystallize. The amount of CaO must be at least 5 wt %, but no more than 30 wt %. If over 30 wt %, there is a risk that the Ca will crystallize with other elements. The amount of $B_2O_3$ must be at least 1 wt % but no higher than 40 wt %. If greater than that, there is a risk that the composition will not vitrify. The amount of PbO must be no higher than 50 wt %. If over 50 wt %, it is difficult to obtain a sufficiently high softening point. The amount of PbO is preferably 0–30 wt %, more preferably 0–20 wt %. The amount of $Al_2O_3$ must be no greater than 20 wt %. If over 20 wt %, the composition will not vitrify. The content of $Al_2O_3$ is preferably 0–5 wt %.

The first glass is used in a ratio of 5–35 wt %, based on the total weight of the composition, including the organic medium. If based on total inorganic solids, the use ratio is 7–50 wt %, preferably 14–36 wt %.

The second glass is a PbO-$SiO_2$ system glass containing at least 50 wt % PbO. Only by using the above-indicated first glass combined with this second glass was a reduction in the shape effect of TCR of the resistors attained.

The second glass is preferably a glass that contains 50–80 wt % PbO, 10–35 wt % $SiO_2$, 0–10 wt % $Al_2O_3$, 1–10 wt % $B_2O_3$, 1–10 wt % CuO, and 1–10 wt % ZnO, with the PbO, $SiO_2$, $Al_2O_3$, $B_2O_3$, CuO, and ZnO comprising at least 95 wt % thereof. The reason is that by mixing a second glass having a composition within this range with the first glass, sinterability improves in addition to little shape effect of TCR or variation in resistance values and TCR due to firing of the overcoat glass.

The second glass is used in a ratio of 5–40 wt %, preferably 10–35 wt %, based on the total weight of the composition that contains organic solvent. If based on total inorganic solids, the amount is 7–57 wt %, preferably 14–50 wt %.

The thick-film resistor composition used in this invention can also contain a third glass as glass binder. This third glass is a PbO-$SiO_2$ system glass prepared so that its softening point is lower than that of the first glass and higher than that of the second glass. For example, it has a composition of 65.0 wt % PbO, 34.0 wt % $SiO_2$, and 1.0 wt % $Al_2O_3$.

The third glass is used in a ratio of 0–30 wt %, preferably 5–25 wt %, based on the total weight of the composition that contains the organic medium. Based on total inorganic solids, the amount is 0–43 wt %, preferably 7–36 wt %.

The glasses used as inorganic binder in this invention, including the first, second, and third glasses, may each contain less than 5 wt % of components for adjusting the coefficient of thermal expansion of the thick-film resistors and the aging temperature of the glass binder. The 96% alumina ceramic commonly used as substrate has a coefficient of thermal expansion of $75 \times 10^{-7}/°C$., so the coefficient of thermal expansion of the thick-film resistors is preferably lower than that. The coefficient of thermal expansion can be adjusted by controlling the content of silica, lead oxide, and boron oxide. The coefficient of thermal expansion can sometimes be adjusted by also introducing small amounts of oxides of lithium, potassium, or sodium. Inclusion of up to about 3 wt % lithium oxide in the glass binder components is advantageous. Up to about 4% of $ZrO_2$ reinforces the resistance of the glass to dissolution in alkali solutions, and $TiO_2$ reinforces the resistance of the glass to attack by acid. When the glass is a zinc aluminoborosilicate glass that does not contain PbO, the preferred thermal expansion coefficient range can be obtained by including $Na_2O$.

The first, second, and third glasses used as inorganic binder can each be prepared by the usual glass manufacturing techniques. That is, they can be produced by mixing the desired components of their precursors, e.g., $H_3BO_3$ for $B_2O_3$, in the desired ratios and heating this mixture to form a melt. As is known in the art, the heating is carried out to the peak temperature and for the time it takes the melt to become completely a liquid and evolution of gas to stop. In this invention, the peak temperature is in the range of 1100°–1500° C., usually 1200°–1400° C. Next, the melt is quenched, typically by cooling on a cool belt or by pouring it into cold running water. Afterwards, the particle size can be reduced by milling as desired.

More specifically, these glasses can be produced by melting at about 1200°–1400° C. for 20 minutes to 1 hour in a platinum crucible in an electrically heated silicon carbide furnace. The final particle size can be made 1–10 $m_2/g$ by treatment with a tumbling or vibrating mill. In treatment with a vibrating mill, the inorganic powder and cylinders of alumina, etc., are placed in a container, and then this container is caused to vibrate in an aqueous medium for a specified number of hours.

Inorganic Additives

The thick-film resistor composition used in this invention can also contain inorganic additives such as $ZrSiO_4$ and metal oxides, e.g., MnO and $Nb_2O_5$, in order to improve laser trimming properties in cases where laser trimming of the thick-film resistors will be necessary or to adjust TCR. These inorganic additives can be used in a ratio of 0–20 wt % based on the total weight of the composition that contains the organic medium or a ratio of 0–30 wt % based on total inorganic solids.

Organic Medium

These inorganic solids of the thick-film resistor compositions used in this invention are dispersed in an organic medium to give a printable composition paste. The organic medium is used in a ratio of 20–40 wt %, preferably 25–35 wt %, based on the total weight of the composition.

All inert liquids can be used as the vehicle. Water or any one of various organic liquids, with thickener and/or stabilizer and/or other common additives added or not added, can be used as the vehicle. Examples of organic liquids that can be used are aliphatic alcohols, esters of those alcohols such as acetate and propionate, terpenes such as turpentine, terpineol, etc., and resins in a solvent such as turpentine or monobutyl ether of ethylene glycol monoacetate, e.g., a solution of polymethacrylate of a lower alcohol or a solution of ethyl cellulose. Volatile liquids for promoting rapid set up after application to the substrate can be included in the vehicle, or the vehicle can be comprised of this. The preferred vehicles are based on ethyl cellulose and β-terpineol.

The resistor composition used in this invention can be produced with a triple-roll mill, for example. After the specified inorganic solids and vehicle have been mixed, the paste is kneaded with the roll mill.

FIG. 1 shows the cross section of a thick-film resistor circuit to explain the manufacturing process of the thick-film resistor elements of this invention.

In process S1 of the manufacturing process of the thick-film resistor elements of this invention, if a dry film 1 has been used, the polyethylene cover film (not shown) is removed, the photopolymerizable layer 1 that constitutes the photoresist layer, which is about 16–75 μm thick, preferably 30–50 μm thick, is laminated on the clean surface of a heat-resistant insulating substrate 2, such as an alumina substrate, using a hot roll laminator whose rolls have been heated to 75°–120° C. and whose laminating rate is 30–100 cm/min. The laminated element, which is the substrate with this photopolymerizable layer laminated on it, is exposed to actinic rays through a highly transparent image 3, the pattern of the resistor shape to be formed appearing as a non-transparent area on a transparent background. In process S2, the resist corresponding to the non-transparent region is dissolved by developing by a known method the photopolymerizable layer 1 of the photoresist film from which the support film (not shown), made from polyethylene terephthalate, for example, had been peeled after exposure, and the thick-film resistor composition is filled in the pattern area 4 where the resist has been developed and removed. Appropriate developers for obtaining the pattern area 4 to be filled with the thick-film resistor paste are aqueous alkali, methanol, ethanol, methyl ethyl ketone, and acetone. In exposure, photoirradiation is carried out using an ultrahigh pressure mercury vapor lamp, for example, as it is usually done, and the photopolymerizable layer forms cross-links or dimerizes and cures.

In the process of forming a resistor element using a liquid resist ink composition instead of a dry film, the point of difference is that the substrate surface is coated by a known method of screen printing, roll coating, or curtain coating, etc., as opposed to laminating a film on the substrate with a hot roll laminator. Otherwise, the processes are the same as described above.

Next, in process S3, the thick-film resistor composition 5, which has an appropriate viscosity due to adjusting the vehicle content, is coated to a wet thickness of about 10–30 μm, preferably 15–20 μm, on substrate 2, for example, alumina ceramic, depending on the photopolymerizable layer 1 of the photoresist film frame that constitutes the resistor shape pattern area 4 to be printed, as described earlier. Next, in process S4, the pattern of the resistor composition 5 filled in this film frame is dried at about 80°–150° C. for 5–15 minutes. Likewise in process S4, calcination to sinter the finely divided particles of inorganic binder and metal is preferably carried out in a well-ventilated belt conveyor oven using a temperature profile that makes possible incineration of the organic substances at about 300°–600° C., a period of maximum temperature of about 800°–950° C. that continues for about 5–15 minutes, oversintering following that, and a cooling cycle controlled to prevent fracture of the substrate that can arise from unwanted chemical reactions at moderate temperatures or from cooling too rapidly. The entire calcining process preferably takes place over about 1 hour: 20–25 minutes to attain calcination temperature, about 10 minutes at calcinating temperature, and about 20–25 minutes in cooling. The photopolymerizable layer of the photoresist film in which the resistor shape pattern has been formed disappears upon calcining the resistor composition in that process S4, and as a result, the desired resistor layer (R) 6 is formed on the substrate 1.

Next, in process S5, a conductive paste obtained by kneading 65 wt % of Ag, 5 wt % of Pd, a vehicle that contains solvent, and an inorganic binder is screen printed, for example, so that part overlaps the resistor layer (R) 6 baked on the substrate 2 and then heated at 950° C. for 20 minutes to bake to form the top electrode layer (electrode C1). A thick-film resistor element is obtained by this. When manufacturing chip resistors, if necessary, a conductive paste using a thermosetting resin, for example, is also coated so that part overlaps the top electrode layer, cured at 150° C. for 30 minutes, for example, with a drier to form an edge electrode (electrode C2). To protect the circuit, for example, forming a cover coat by coating or printing an insulating resin or a paste of low-melting glass powder, drying, and calcining can also be considered.

As indicated above, the manufacturing method of this invention forms a thick film by using a photopolymerizable layer adhered to a substrate and fills a resistor composition in the film frame that forms the resistor shape pattern of the photoresist relief image, rather than using the conventional manufacturing process and screen printing to print a thick-film resistor composition on the substrate. The structure and dimensional characteristics of the thick-film resistor elements are greatly different, as will be discussed below. Consequently, according to the manufacturing method of this invention, resistors that have uniform thickness and extremely inhibited variation in resistance values can be prepared on a substrate with high pattern precision.

Figure 2:
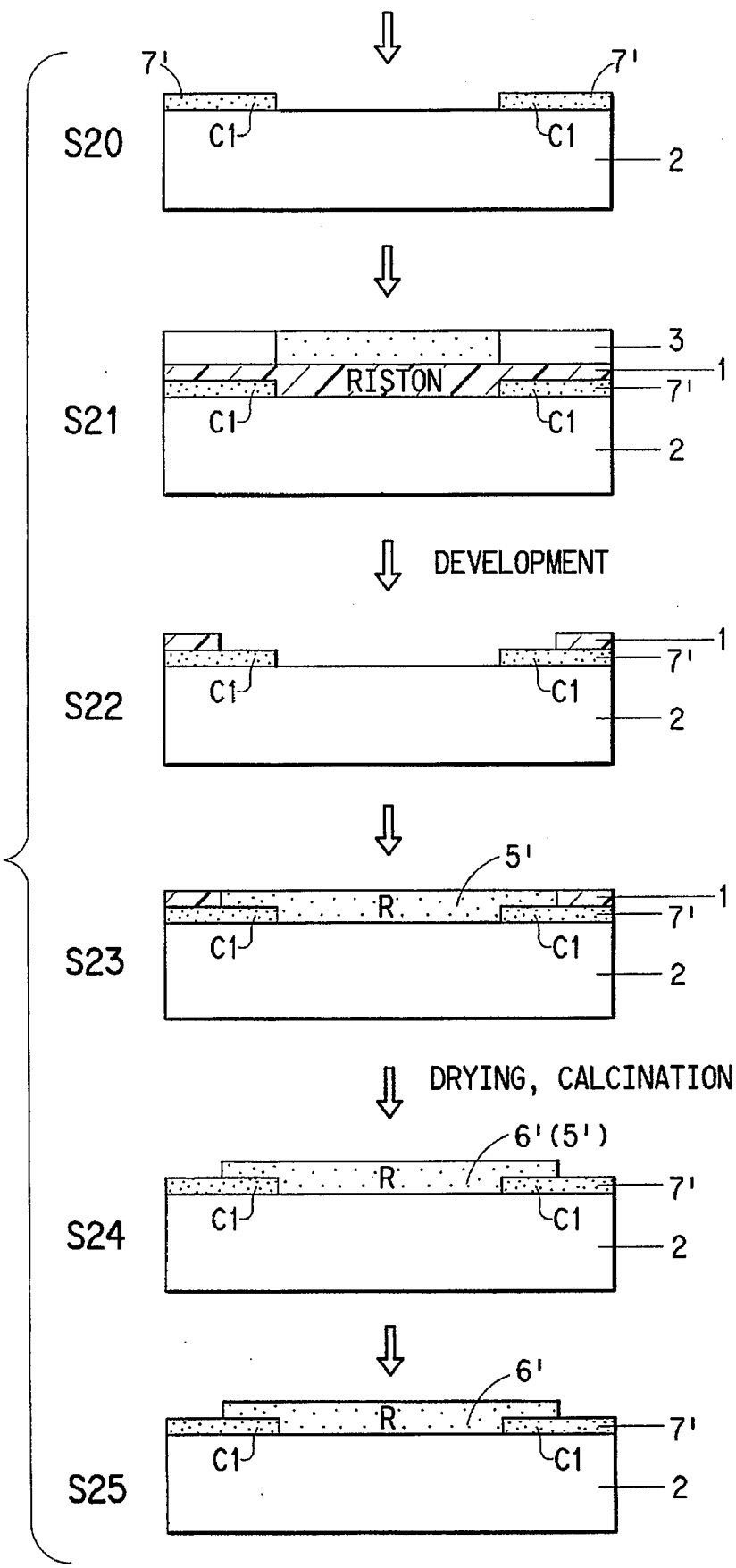
FIG. 2 is a cross section of a thick-film electronic circuit that shows another example of the method of manufacturing thick-film resistor elements of the thick-film electronic circuits of this invention.

FIG. 2 shows a cross section of each process of manufacturing a thick-film electronic circuit to show another example of the method of manufacturing thick-film resistor elements of this invention shown in FIG. 1.

Processes S21 through S25 of FIG. 2 are the same as processes S1 through S5, respectively, explained in FIG. 1. The difference between the manufacturing method shown in FIG. 1 and the manufacturing processes shown in FIG. 2 is that in the manufacturing process shown in FIG. 2, the top electrode layer (electrode C1) 7' is provided in advance by printing, drying, and calcining the conductor paste on substrate 2 in process S20 before laminating the photopolymerizable layer 1, which is the photoresist layer, on the substrate 2 in process S21. Thereafter, the same treatments as in process S1 and process S5 explained in FIG. 1 are carried out in process S21 and process S25. The thickness of photoresist layer 1 is appropriately selected by taking into consideration the thickness of the resistor layer (R) 6' and the thickness of the electrodes (C1) 7' that will ultimately be formed.

A concrete example of comparing various characteristics of the product manufacturing by the process of this invention and the product manufactured by the convention process is shown below.

Figure 3:
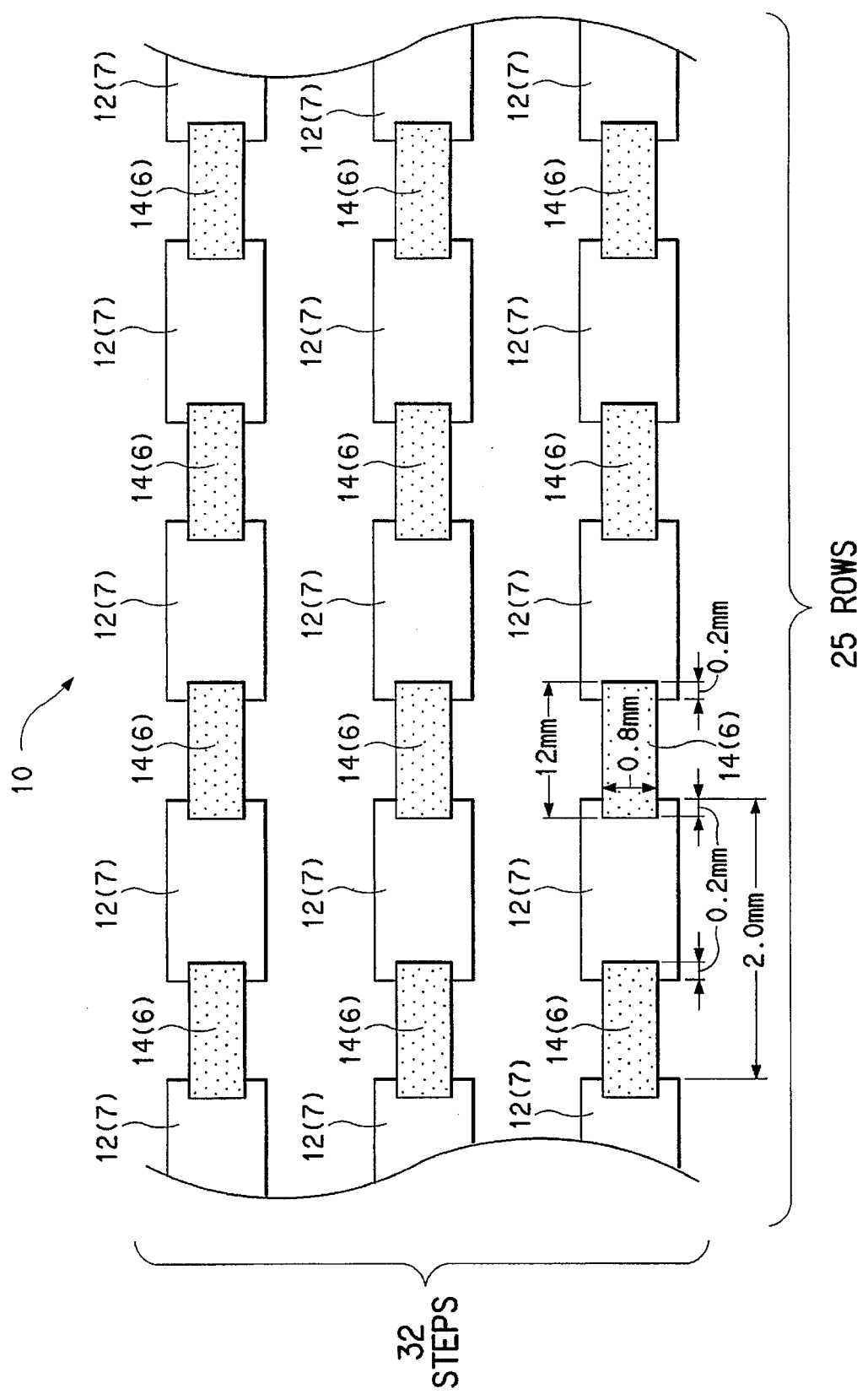
FIG. 3 is a drawing that explains the fabrication of samples for comparing and testing the variation of individual resistors formed by the method of manufacturing thick-film resistor elements of this invention and by the conventional method.

As shown in FIG. 3, resistor layer 14 was formed by screen printing a thick-film silver paste that contains (based on weight) 5% Pd, 65% Ag, and 30% organic binder on the surface of 96 alumina substrate 10 using a 400-mesh screen (stainless steel mesh, 10-μm thick, 8×10 inch frame) (so that the dry film thickness was 10 μm), drying, and calcining at a temperature of 850° C. with a belt-type continuous calcining furnace (profile: peak time 6 min., in-out time 45 min.), screen printing and drying a pair of top electrode layers 2 with a distance of 0.8 mm between electrodes and then a thick-film resistor paste (Example 1) composed mainly of $RuO_2$ so as to overlap part of the top electrode layers 12, and calcining with a belt-type continuous calcining furnace (profile: peak time of 6 min. at temperature of 850° C. and in-out time of 45 min.).

The size of the resistor layer 14 was 1.2 mm×0.8 mm, the width of the part that overlaps the top electrode layer 12 is 0.2 mm, the pitch between the resistors is 2.0 mm. A set of these resistors was formed so that there were 32 steps in the longitudinal direction and 25 rows in the width direction. The composition of Example 1 was as follows.

Example 1

| | |
|---|---|
| $RuO_2$ | 16% |
| Glass A (No. 4 of Table 1) | 20% |
| Glass B (No. 5 of Table 2) | 24% |
| Organic medium | 40% |

EXAMPLE

A dry film-type photoresist manufactured by DuPont under the product name Riston® (50 μm thick) was laminated on the surface of a 96 alumina substrate 10 on which top electrode layers 7 had been formed as shown in FIG. 3 in the same manner as in the comparison example, using a Riston®-type HRL-24 hot roll laminator.

This laminated element was exposed using a 5-kW ultra-high pressure mercury vapor lamp through the exposure original to dissolve and remove the Riston® film according to the pattern of the resistor set 6 shown in FIG. 3. Then it was developed for 40 seconds with a 1% sodium carbonate solution in a spray treatment machine and dried. Next, just as in the comparison example, the thick-film resistor composition of Example 1 was applied to a wet thickness of about 50 μm on a substrate, e.g., alumina ceramic, by the resist relief film formed with Riston® film. Then the pattern of the resistor composition filled in this film frame was dried at about 80°–150° C. for about 5–15 minutes. The calcination used to sinter the finely divided particles of inorganic binder and metal is preferably in a well-ventilated belt conveyor oven using a temperature profile that makes possible incineration of organic substances at about 300°–600° C., a maximum temperature time at about 800°–950° C. that continues about 5–15 min., oversintering that follows that, and a cooling cycle controlled in order to prevent fracture of the substrate that can occur from unwanted chemical reactions at moderate temperatures or too rapid cooling. The total calcining process preferably takes about 1 hour—20 to 25 minutes to reach calcining temperature, about 10 minutes at calcining temperature, and about 20 to 25 minutes in cooling.

Five samples of the resistors formed as thick films on substrates in the above practical example and comparison example were selected, and the dry film thickness of the resistor samples (5×32) were measured with a contact-type film-thickness gauge (Surfcom manufactured by Nippon Seimitsu K. K.). The results are shown in Tables 3-1, and 3-2 and Table 4. The resistance values after calcination of the practical example and comparison example were determined with probes of the terminal pattern using an autoranging/autobalancing digital ohmmeter of 0.01% precision on samples similar to the above. Specifically, the samples were placed on the terminal posts in the chamber and connected electrically to the digital ohmmeter. The results are shown in Table 4.

TABLE 3-1

| Steps/Rows | Dry film thickness of individual resistors of the example of this invention, $T_i$ (μm) | | | | | |
| --- | --- | --- | --- | --- | --- | --- |
| | 1 | 2 | 3 | 4 | 5 | |
| 1 | 24.1 | 24.7 | 24.9 | 24.8 | 25 | |
| 2 | 24.7 | 24.3 | 24.5 | 24.7 | 25 | |
| 3 | 25.3 | 24.6 | 24.9 | 24.8 | 25.1 | |
| 4 | 24.9 | 24.6 | 24.8 | 24.9 | 24.6 | |
| 5 | 24.5 | 24.7 | 24.8 | 24.2 | 25 | |
| 6 | 24.9 | 24.5 | 24.5 | 24.6 | 24.5 | |
| 7 | 25 | 25.1 | 24.3 | 24.7 | 24.2 | |
| 8 | 24.3 | 24.6 | 24.6 | 24.1 | 24.6 | |
| 9 | 24.9 | 24.1 | 24.9 | 24.2 | 24.5 | |
| 10 | 24.6 | 24.6 | 24.1 | 24.3 | 24.6 | |
| 11 | 24.6 | 24.1 | 24.1 | 24.5 | 24.6 | |
| 12 | 24.1 | 24.5 | 24.3 | 24.3 | 24.7 | |
| 13 | 24.9 | 24.1 | 24.7 | 24.6 | 24.1 | |
| 14 | 24.7 | 24.6 | 24.1 | 26.1 | 24.6 | |
| 15 | 24.8 | 24.3 | 24.1 | 24.3 | 24.9 | |
| 16 | 24.6 | 24.1 | 24.1 | 24.1 | 24.6 | |
| 17 | 24.6 | 25 | 24.1 | 24.9 | 24.6 | |
| 18 | 24.3 | 24.2 | 24.2 | 24.3 | 24.2 | |
| 19 | 24.8 | 24.6 | 24.6 | 24.6 | 24.6 | |
| 20 | 24.9 | 24.1 | 24.6 | 24.6 | 24.6 | |
| 21 | 24.6 | 24.5 | 24.7 | 24.8 | 24.8 | |
| 22 | 24.2 | 24.6 | 24.3 | 24.6 | 24.5 | |
| 23 | 24.7 | 24.6 | 24.6 | 24.2 | 24.6 | |
| 24 | 24.6 | 25 | 24.2 | 24.9 | 24.1 | |
| 25 | 24.6 | 24.6 | 24.6 | 24.6 | 24.8 | |
| 26 | 24.6 | 24.1 | 24.1 | 25 | 24.7 | |
| 27 | 25.1 | 24.6 | 24.7 | 24.6 | 25.1 | |
| 28 | 24.7 | 24.7 | 24.6 | 24.1 | 24.6 | |
| 29 | 24.9 | 24.5 | 26 | 24.9 | 24.7 | |
| 30 | 24.9 | 24.6 | 24.7 | 25 | 24.6 | |
| 31 | 24.8 | 24.6 | 24.7 | 24.7 | 24.9 | |
| 32 | 24.7 | 24.6 | 24.7 | 24.8 | 24.6 | |
| $T_{av}$ (μm) (arith. mean film thickness of all samples tested) | 24.684376 | 24.5125 | 24.503125 | 24.5876 | 24.646975 | |
| n (number of samples) | 32 | 32 | 32 | 32 | 32 | Total 160 |
| σ (μm) = [Zi ($T_i$ − $T_{av}$)$^2$]/(n − 1) | 0.2736956 | 0.2685084 | 0.2912535 | 0.2959403 | 0.2602534 | |
| CV (diffusion coefficient) = (σ/$T_{av}$) × 100% | 1.1087807 | 1.0953999 | 1.1886384 | 1.2036206 | 1.0559266 | |

TABLE 3-2

| Steps/Rows | Dry film thickness of individual resistors of the comparison example, $T_i$ (μm) | | | | |
| --- | --- | --- | --- | --- | --- |
| | 1 | 2 | 3 | 4 | 5 |
| 1 | 26.4 | 26.2 | 25.4 | 24.8 | 26 |
| 2 | 26.2 | 26.6 | 25 | 25.4 | 26.2 |
| 3 | 26 | 26 | 24.2 | 25 | 25.8 |
| 4 | 26.2 | 26.2 | 25 | 25.4 | 25.8 |
| 5 | 25.8 | 25 | 25.2 | 25.8 | 25.6 |
| 6 | 25.8 | 24.6 | 24.2 | 25 | 26 |
| 7 | 26 | 25.4 | 24.2 | 25 | 26.2 |
| 8 | 26.2 | 2G.8 | 25.4 | 25.8 | 25 |
| 9 | 26 | 25.8 | 24 | 25 | 26.8 |
| 10 | 26.2 | 25.4 | 25 | 26 | 25 |
| 11 | 25.8 | 25.4 | 24.G | 2S | 25 |
| 12 | 25.6 | 25 | 24.2 | 25.8 | 25.8 |
| 13 | 25 | 25 | 24 | 25 | 25 |
| 14 | 25.8 | 25.8 | 25.8 | 24 | 25.6 |
| 15 | 26 | 25 | 24.2 | 24.2 | 25 |

TABLE 3-2-continued

| Steps/Rows | Dry film thickness of individual resistors of the comparison example, $T_i$ (μm) | | | | | |
|---|---|---|---|---|---|---|
| | 1 | 2 | 3 | 4 | 5 | |
| 16 | 26.2 | 2S | 24 | 25 | 25.6 | |
| 17 | 25.8 | 24 | 25.4 | 25.8 | 25 | |
| 18 | 25.6 | 25.4 | 24 | 25 | 25.8 | |
| 19 | 25.6 | 25 | 24.2 | 25 | 25 | |
| 20 | 2S.8 | 25.8 | 24 | 24 | 25.8 | |
| 21 | 25 | 2S | 24 | 24.2 | 25 | |
| 22 | 27.2 | 25.4 | 25.2 | 25 | 25.8 | |
| 23 | 25.8 | 25.4 | 25 | 25.8 | 26 | |
| 24 | 25.8 | 25.8 | 24 | 26 | 26.2 | |
| 25 | 25 | 26 | 25 | 24 | 25.8 | |
| 26 | 25.4 | 26 | 24 | 25.4 | 26 | |
| 27 | 26 | 25.2 | 24.4 | 25.8 | 26.2 | |
| 28 | 26.2 | 25 | 24 | 24 | 25.8 | |
| 29 | 26 | 25 | 24.6 | 25.4 | 25.6 | |
| 30 | 25.8 | 2S.8 | 24.2 | 2S.8 | 25.6 | |
| 31 | 25 | 25 | 25 | 25.4 | 25.8 | |
| 32 | 25.8 | 25 | 24.2 | 25.8 | 25 | |
| $T_{av}$ (μm) (arith. mean film thickness of all samples (tested) | 25.84375 | 25.375 | 24.556255 | 25.08125 | 25.618755 | |
| n (number of samples) | 32 | 32 | 32 | 32 | 32 | Total 160 |
| σ (μm) = [Zi ($T_i$ − $T_{av}$)$^2$]/(n − 1) | 0.4507616 | 0.5370168 | 0.5658704 | 0.5964613 | 0.4291303 | |
| CV (diffusion coefficient) = (σ/ $T_{av}$) × 100% | 1.744179 | 2.1163226 | 2.2636617 | 2.3761166 | 1.6750653 | |

TABLE 4

| | | Practical example (using photopolymerizable layer) | Comparison example (by screen printing) |
|---|---|---|---|
| Resistor dry film thickness | Mean film thickness | 24.6 μm | 25.3 μm |
| | CV | 1.16 | 2.69 |
| Resistance value | Mean value CV | 1.684 kΩ | 1.608 kΩ |
| | | 1.51 | 3.75 |
| Number of samples | n | 160 | 160 |

As indicated above, according to the manufacturing method of this invention, thick-film resistors can be manufactured by applying a thick-film resistor composition, obtained by dispersing a conductive component and inorganic binder in an organic medium and which has a specified theology, through a clear relief image obtained by exposing, curing, and developing a resist layer of a photopolymerizable mixture formed on an insulating substrate according to a resist pattern, and the thick-film paste obtained at that time is almost the same thickness as the photopolymerizable layer on the surface of the insulating substrate and is patterned according to a high-precision pattern defined by the sharp, linear, lateral edge enclosed by the resist image removed by development.

What is claimed is:

1. A method of manufacturing thick-film resistor elements comprising the sequential steps:

(a) printing and calcinating a conductive material to form electrodes on a surface of a heat-resistant insulating substrate;

(b) forming a photopolymerizable layer over the electrodes and substrate which is devoid of electrodes;

(c) imagewise exposing the photopolymerizable layer to actinic radiation;

(d) developing the exposed layer and removing the photopolymerizable layer that was not exposed;

(e) applying a thick-film resistor material, which consists of a conductive component and an inorganic binder in an organic medium, on the surface of the substrate so that the material overlaps the electrodes to form a patterned thick film;

(f) drying and calcinating the thick-film to volatilize the organic medium of the thick film resistor material; and (g) sintering to fuse glass contained in the resistor material.

2. The method of manufacturing a thick-film resistor elements of claim 1, wherein the photopolymerizable layer is a dry film-type photoresist.

3. The method of manufacturing the thick film resistor elements of claim 2 wherein the photopolymerizable layer is about 16–75 μm thick.

4. The method of manufacturing the thick-film resistor elements of claim 1, wherein the photopolymerizable layer is a liquid resist ink that can be developed.

5. The method of manufacturing the thick film resistor elements of claim 4 wherein the photopolymerizable layer is about 16–75 μm thick.

6. The method of manufacturing the thick film resistor elements of claim 1 wherein the photopolymerizable layer is about 16–75 μm thick.

* * * * *